(12) United States Patent
Wang et al.

(10) Patent No.: US 12,388,426 B2
(45) Date of Patent: Aug. 12, 2025

(54) FLIP-FLOP CELL

(71) Applicant: Taiwan Semiconductor Manufacturing Company, Ltd., Hsinchu (TW)

(72) Inventors: Shao-Yu Steve Wang, Hsinchu (TW); Chien-Te Wu, Hsinchu (TW); Shang-Chih Hsieh, Hsinchu (TW); Nick Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/305,996

(22) Filed: Apr. 24, 2023

(65) Prior Publication Data

US 2024/0128955 A1  Apr. 18, 2024

Related U.S. Application Data

(63) Continuation of application No. 17/403,126, filed on Aug. 16, 2021, now Pat. No. 11,637,547, which is a continuation of application No. 16/536,933, filed on Aug. 9, 2019, now Pat. No. 11,095,272.

(60) Provisional application No. 62/734,589, filed on Sep. 21, 2018.

(51) Int. Cl.
*H03K 3/037* (2006.01)
*G06F 1/04* (2006.01)

(52) U.S. Cl.
CPC .............. *H03K 3/037* (2013.01); *G06F 1/04* (2013.01)

(58) Field of Classification Search
CPC .................................. H03K 3/037; G06F 1/04
USPC ...................................................... 331/107 R
See application file for complete search history.

(56) References Cited

U.S. PATENT DOCUMENTS

| 5,013,942 | A | 5/1991 | Nishimura et al. |
| 5,029,279 | A | 7/1991 | Sasaki et al. |
| 5,208,764 | A * | 5/1993 | Rusu .............. G01R 31/318583 716/135 |
| 6,781,435 | B1 | 8/2004 | Gupta et al. |
| 8,076,965 | B2 * | 12/2011 | Djaja .................. H03K 3/0372 327/202 |
| 8,595,668 | B1 | 11/2013 | Soni et al. |
| 11,095,272 | B2 * | 8/2021 | Wang ..................... H03K 3/037 |
| 11,637,547 | B2 * | 4/2023 | Wang ..................... H03K 3/037 331/107 R |
| 2007/0293160 | A1 | 12/2007 | Gupta et al. |
| 2008/0036498 | A1* | 2/2008 | Koana ........................ G06F 1/10 326/93 |
| 2008/0218235 | A1* | 9/2008 | Sekine ............... H03K 3/35625 327/212 |
| 2016/0233853 | A1* | 8/2016 | Kamal ............. H03K 3/356182 |
| 2016/0283427 | A1 | 9/2016 | Chaudhari et al. |

(Continued)

*Primary Examiner* — Richard Tan
(74) *Attorney, Agent, or Firm* — Merchant & Gould P.C.

(57) ABSTRACT

An integrated circuit includes a semiconductor substrate and a plurality of circuit elements in or on the substrate. The circuit elements are defined by standard layout cells selected from a cell library. The circuit elements including a plurality of flip-flops. Each flip-flop has a data input terminal, a data output terminal, a clock input terminal, and a clock output terminal. A first one of the flip-flops directly abuts a second flip-flop such that the clock output terminal of the first flip-flop electrically connects with the clock input terminal of the second flip-flop.

19 Claims, 8 Drawing Sheets

(56) References Cited

U.S. PATENT DOCUMENTS

2016/0299524 A1 10/2016 Rajagopal et al.
2018/0367128 A1 12/2018 Vezyrtzis et al.

* cited by examiner

FLIP-FLOP CELL

CROSS REFERENCE TO RELATED APPLICATION

This application is a Continuation of U.S. patent application Ser. No. 17/403,126, filed Aug. 16, 2021, which is a continuation of U.S. patent application Ser. No. 16/536,933, filed Aug. 9, 2019, which claims the benefit of U.S. Provisional Application No. 62/734,589, filed Sep. 21, 2018, and titled "Flip-Flop Cell," the entire disclosures of which are hereby incorporated herein by reference.

BACKGROUND

Integrated circuits typically include thousands of components having complex interrelationships. These circuits are generally designed using highly automated processes known as electronic design automation (EDA). EDA begins from a functional specification provided in a hardware description language (HDL) and continues through the specification of a circuit design including the specification of elementary circuit components called cells, the physical arrangement of the cells, and the wiring that interconnects the cells. The cells implement logic or other electronic functions using a particular integrated circuit technology.

EDA can be divided into a series of stages such as synthesis, placement, routing, etc. Each of these steps can involve selecting cells from a library of cells. Typically, a very large number of different circuit designs using various cell combinations can meet a functional specification for a circuit. For example, flip-flops are fundamental building blocks of digital circuits and thus are often included in standard cell libraries. A flip-flop is a circuit that has two stable states and can be used to store state information. Flip-flops have one or two outputs and can be made to change state by signals applied to one or more control inputs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
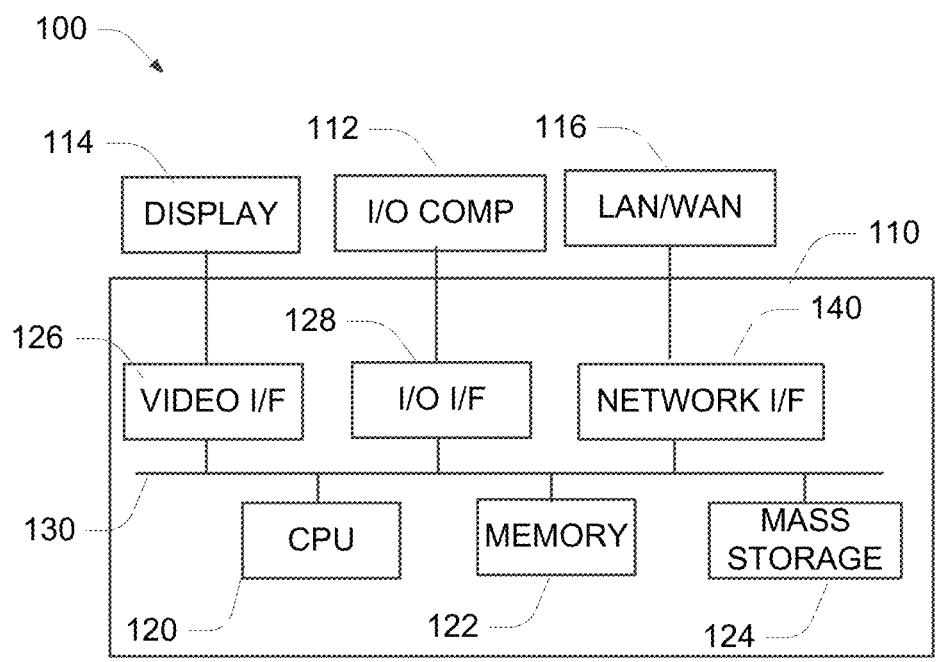
FIG. 1 is a block diagram illustrating an example of a processing system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Electronic Design Automation (EDA) tools and methods facilitate the design, partition, and placement of microelectronic integrated circuits on a semiconductor substrate. This process typically includes turning a behavioral description of the circuit into a functional description, which is then decomposed into logic functions and mapped into cells using a standard cell library. Once mapped, a synthesis is performed to turn the structural design into a physical layout, a clock tree is built to synchronize the structural elements, and the design is optimized post layout.

FIG. 1 is a block diagram illustrating an example of a processing system 100 in accordance with some embodiments disclosed herein. The processing system 100 may be used to implement an EDA system in accordance with various processes discussed herein. The processing system 100 includes a processing unit 110, such as a desktop computer, a workstation, a laptop computer, a dedicated unit customized for a particular application, a smart phone or tablet, etc. The processing system 100 may be equipped with a display 114 and one or more input/output devices 112, such as a mouse, a keyboard, touchscreen, printer, etc. The processing unit 110 also includes a central processing unit (CPU) 120, memory 122, a mass storage device 124, a video adapter 126, and an I/O interface 128 connected to a bus 130.

The bus 130 may be one or more of any type of several bus architectures including a memory bus or memory controller, a peripheral bus, or video bus. The CPU 120 may comprise any type of electronic data processor, and the memory 122 may comprise any type of system memory, such as static random access memory (SRAM), dynamic random access memory (DRAM), or read-only memory (ROM).

The mass storage device 124 may comprise any type of storage device configured to store data, programs, and other information and to make the data, programs, and other information accessible via the bus 130. The mass storage device 124 may comprise, for example, one or more of a hard disk drive, a magnetic disk drive, an optical disk drive, flash memory, or the like.

The term computer readable media as used herein may include computer storage media such as the system memory and storage devices mentioned above. Computer storage media may include volatile and nonvolatile, removable and non-removable media implemented in any method or technology for storage of information, such as computer readable instructions, data structures, or program modules. The memory 122 and mass storage device 124 are computer storage media examples (e.g., memory storage). The mass storage device may further store a library of standard cells, as will be discussed further herein below.

Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the processing device 100. Any such computer storage media may be part of the processing device 100. Computer storage media does not include a carrier wave or other propagated or modulated data signal.

Communication media may be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media.

The video adapter 126 and the I/O interface 128 provide interfaces to couple external input and output devices to the processing unit 110. As illustrated in FIG. 1, examples of input and output devices include the display 114 coupled to the video adapter 126 and the I/O device 112, such as a mouse, keyboard, printer, and the like, coupled to the I/O interface 128. Other devices may be coupled to the processing unit 110, and additional or fewer interface cards may be utilized. For example, a serial interface card (not shown) may be used to provide a serial interface for a printer. The processing unit 110 also may include a network interface 140 that may be a wired link to a local area network (LAN) or a wide area network (WAN) 116 and/or a wireless link.

Embodiments of the processing system 100 may include other components. For example, the processing system 100 may include power supplies, cables, a motherboard, removable storage media, cases, and the like. These other components, although not shown, are considered part of the processing system 100.

In some examples, software code is executed by the CPU 120 to analyze a user design to create a physical integrated circuit layout. The software code may be accessed by the CPU 120 via the bus 130 from the memory 122, mass storage device 124, or the like, or remotely through the network interface 140. Further, in some examples, the physical integrated circuit layout is created based on a functional integrated circuit design, which may be received though the I/O interface 128 and/or stored in the memory 122 or 124 in accordance with various methods and processes implemented by the software code.

A standard cell can include an entire device, such as a transistor, diode, capacitor, resistor, or inductor, or can include a group of several devices arranged to achieve some particular function, such as an inverter, a flip-flop, a memory cell, or an amplifier, among others. In addition to making functional design easier to conceptualize, the use of standard cells can reduce verification time for design rule checking (DRC) of the layout features within the IC, because a standard cell that is repeated throughout the layout can be checked a single time in DRC rather than each instantiation being checked individually. Based on the received functional circuit description, the system 100 is configured to select standard cells from the cell library.

As noted above, flip-flop circuits may be included in a standard cell library. A flip-flop is a circuit that has two stable states and thereby is capable of serving as one bit of memory. A flip-flop is usually controlled by one or two control signals and a clock signal. The output often includes the complement as well as the normal output. Flip-flops can be either simple (transparent) or clocked (or non-transparent). Clocked flip-flops are specially designed for synchronous (time-discrete) systems and typically implemented as master-slave devices. Flip-flops can be further divided into types: the RS ("set-reset"), D ("data" or "delay"), T ("toggle"), and JK types are common ones. The D flip-flop is known as a delay flip-flop (as its output Q looks like a delay of input D) or data latch. The behavior of a particular type flip-flop can be described by what is termed the characteristic equation, which derives the "present state" output in terms of the input signal(s) and/or the "previous state" signal of the flip-flops.

The D flip-flop captures the value of the D-input at a definite portion of the clock cycle (such as the rising edge of the clock). That captured value becomes the Q output. At other times, the output Q does not change. The D flip-flop can be viewed as a memory cell, a zero-order hold, or a delay line.

Figure 2:
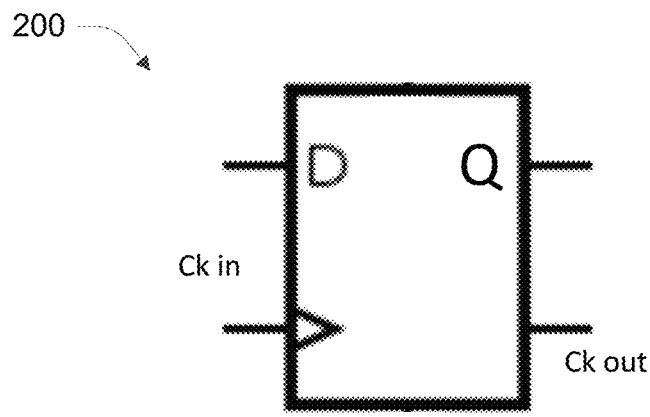
FIG. 2 depicts an example of a D-type flip-flop with a shared clock terminal and one output in accordance with some embodiments.

FIG. 2 depicts an example D-type flip-flop 200 in accordance with aspects of the present disclosure. In this example a single data output terminal, Q, is provided along with a single data input terminal, D, and a clock input terminal, CK in. Additionally, a clock output terminal, CK out, is provided as part of the D-type flip-flop 200. The clock output terminal allows for the clock signal to be shared between a plurality of single-bit flip-flops such that a multi-bit flip-flop may be formed from the single-bit flip-flops.

Figure 3:
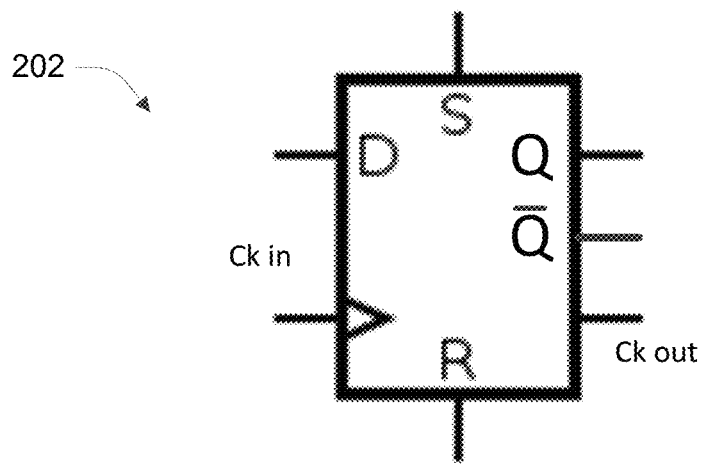
FIG. 3 depicts an example of a D-type flip-flop with a shared clock terminal and two outputs with a set and reset terminal in accordance with some embodiments.

FIG. 3 shows another example of a D-type flip-flop 202 that can be implemented as a single bit of a multi-bit flip-flop. In this example two output terminals, Q and Q-bar are provided along with a single input terminal, D, and a clock input terminal, CK in. Additionally in this example two terminals, S and R, are added to allow for the integrated circuit to set and reset the flip-flop via the S and R terminals, respectively. Additionally, a clock output terminal, CK out, is provided as part of the D-type flip-flop 202. The clock output terminal allows for the clock signal to be shared between a plurality of flip-flops such that a multi-bit flip-flop may be formed from the single-bit flip-flops. Either D-Type flip-flop 200 or 202 can be implemented in a multi-bit flip-flop design with a shared clock signal.

Figure 4:
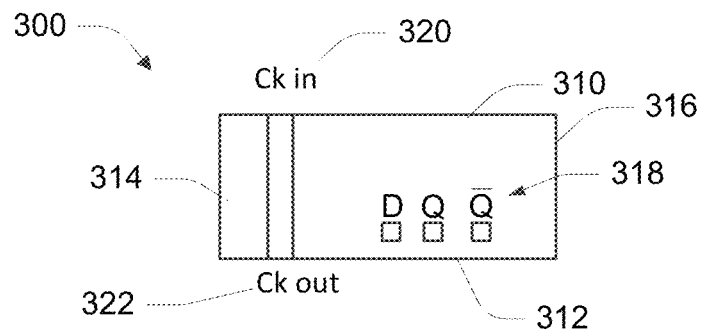
FIG. 4 is a block diagram showing an example of a flip-flop in accordance with some embodiments.

Disclosed embodiments thus include various implementations of a single bit flip-flop with the ability to share a common clock signal. FIG. 4 shows an example flip-flop cell 300 in accordance with some embodiments. The flip-flop 300 is defined by an outer periphery having a first border 310 and a second border 312, wherein the first border 310 is a top border and the second border 312 is a bottom border. The second border 312 is opposite and parallel to the first border 310 in the example shown in FIG. 4. The outer periphery of the flip-flop 300 is further defined by a third border 314 and a fourth border 316, wherein the third border 314 is a first side border and the fourth border 316 is a second side bottom border opposite and parallel to the third border 314. The flip-flop 300 further includes various input/output terminals 318 such a data input terminal D, and data output terminals Q, Q-bar. Additional input/output terminals are provided in various implementations, such as set/reset terminals S, R depending on the specific type of flip-flop implemented by the flip-flop cell 300.

Additionally, the flip-flop 300 includes a clock input terminal 320 that is positioned so as to extend to one of the borders 310, 312, 314, 316. In the example of FIG. 4, the clock input terminal 320 extends to the first border 320. Further, a clock output terminal 322 of the flip-flop is positioned so as to extend to another one of the borders 310, 312, 314, 316. In the example of FIG. 4, the clock output terminal 322 extends to the second border 312 such that the clock input terminal 320 is positioned at a border of the flip-flop periphery opposite the border at which the clock output terminal 322 is positioned. Thus, in the example of FIG. 4, the clock terminals 320, 322 are positioned in a single direction orientation, vertical in the case of the figure. Having the clock input terminal 320 positioned opposite the clock output terminal 322 allows the clock signal to propagate through the flip-flop cell to be shared from one flip-flop to another, in addition to providing the clock pulse for the individual flip-flop 300.

Figure 5:
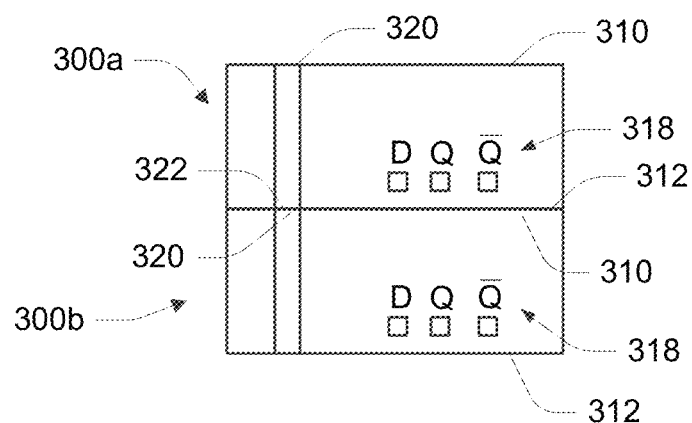
FIG. 5 is a block diagram showing an example of a multi-bit flip-flop constructed from two single bit flip-flop cells in accordance with some embodiments.

FIG. 5 illustrates an example embodiment where two of the flip-flop cells 300a, 300b are situated adjacent one another, such that the first flip-flop 300a directly abuts the second flip-flop 300b such that the clock output terminal 322 of the first flip-flop 300a electrically connects with the clock input terminal 322 of the second flip-flop 300b. More specifically, the second border 312 of the first flip-flop 300a directly abuts the first border 310 of the second flip-flop 300b. Since the clock input terminals 310 and the clock output terminals 322 of the flip-flops 300a, 300b extend to the borders 310, 312, the corresponding clock input/output terminals 310,312 electrically connect one another such that a clock pulse received at the clock input terminal 310 of the top flip-flop 310a propagates through the flip-flop 310a to the clock input terminal 310 of the bottom flip-flop 310b. Thus, the two single bit flip-flop cells 310a, 310b form a multi-bit flip-flop that operates off the same clock pulse.

Figure 6:
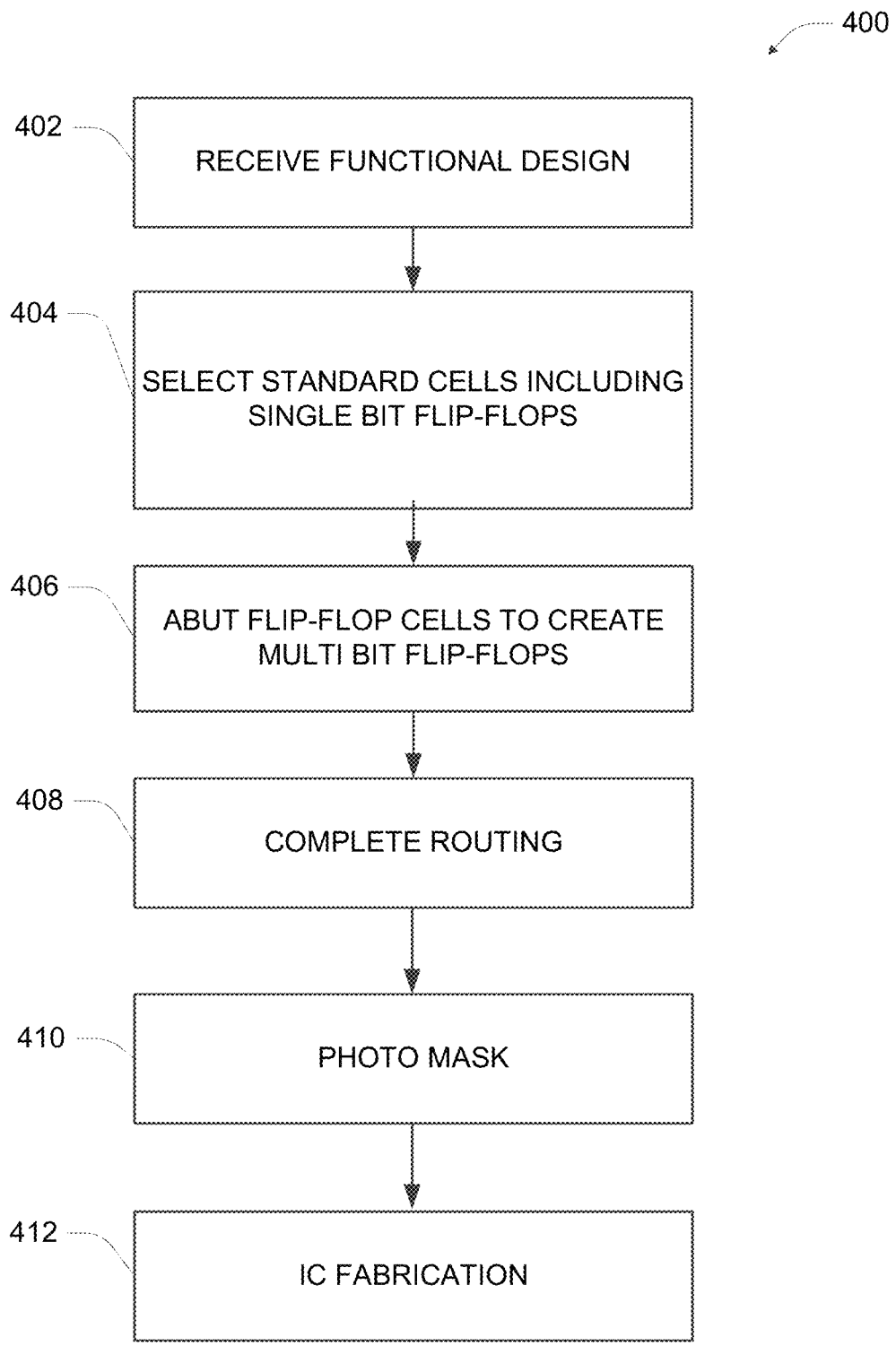
FIG. 6 is a flow diagram illustrating an example of a method for fabricating an integrated circuit device in accordance with some embodiments.

FIG. 6 generally illustrates an example integrated circuit design and fabrication process 400 that may be implemented by the processing system 100 for generating a physical layout from a user supplied behavioral or functional design. The process starts at an operation 402 where a functional design is received. The functional design specifies the desired behavior or function of the circuit based upon various signals or stimuli applied to the inputs of the overall design, and may be written in a suitable programming language. The design may be uploaded into the processing unit 110 through the I/O interface 128 by the user. Alternatively, the design may be uploaded and/or saved in the memory 122 or the mass storage device 124, or the design may be uploaded through the network interface 140 by a remote user.

Proceeding to operation 404, standard cells are selected from a cell library to design the device based on the received functional design. As noted above, the cell library is comprised of a listing of pre-designed components, or cells, each of which may perform a discreet logic function. The cells are stored in the cell library as information comprising internal circuit elements, the various connections to these circuit elements, a pre-designed physical layout pattern that includes the unit height of each cell along with the cell's designed power rails, dopant implants, wells, etc. Additionally the stored cell may also comprise a shape of the cell, terminal positions for external connections, delay characteristics, power consumption, etc. In some examples, the functional design is initially synthesized and an initial netlist is generated containing individual, single bit flip-flops, and cell placement of these single bit flip-flops is initially performed. The standard library includes flip-flops with input and output terminals allowing for a shared clock signal as discussed above. At operation 406, the single bit flip-flops are merged and replaced with flip-flop cells that are abutted adjacent to one another to form multi-bit flip-flops. In some examples, the processing system 100 is configured to determine the number of abutted flip-flop cells 300 abutted to one another to make up the multi-bit flip-flops based on design parameters and power, performance and area (PPA) requirements, which may also be stored in the memory 122 or mass storage device 124 of the processing system 100.

At operation 408 a final synthesis is performed on the design, in which the cell placement and routing is completed using the multibit flip-flops made up of the abutted flip-flop cells 300, and the behavior and/or functions desired from the design are transformed to a functionally equivalent logic gate-level netlist including the merged flip-flop cells.

At operation 410 a photolithographic mask is generated. With the photo mask created, the process proceeds to operation 412 where the integrated circuit is fabricated based on the photo mask.

Figure 7:
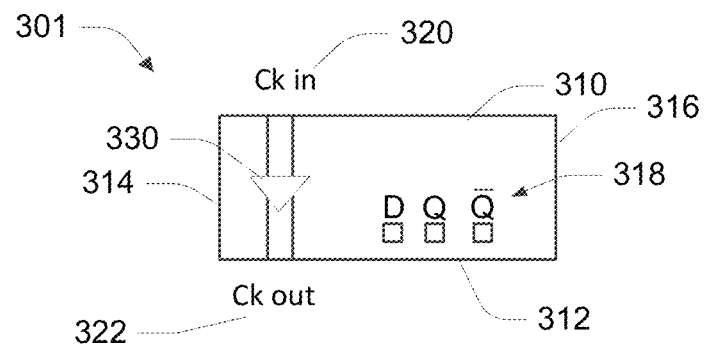
FIG. 7 is a block diagram showing an example of a driver type in accordance with some embodiments.

FIG. 7 portrays another example single bit flip-flop 301, which is configured as a driver type flip-flop. Similar to the previous example, the flip-flop 301 is defined by an outer periphery having a first (top) border 310 and a second (bottom) border 312, a third (first side) border 314 and a fourth (opposite side) border 316. The flip-flop 301 further includes the input/output terminals 318 such a data input terminal D, and data output terminals Q, Q-bar.

Additionally, the flip-flop 301 includes an amplifier 330 having an input connected to the clock input terminal 320 and an output connected to the clock output terminal 322. The clock input 320 and output 322 terminals extend to the first and second border respectively to allow for a shared clock signal to be propagated. The amplifier 330 is configured to amplify the clock pulse received at the clock input terminal 320 to propagate the clock pulse to the clock input terminals receiver flip-flops, which as discussed below, does not necessarily include an amplifier.

Figure 8:
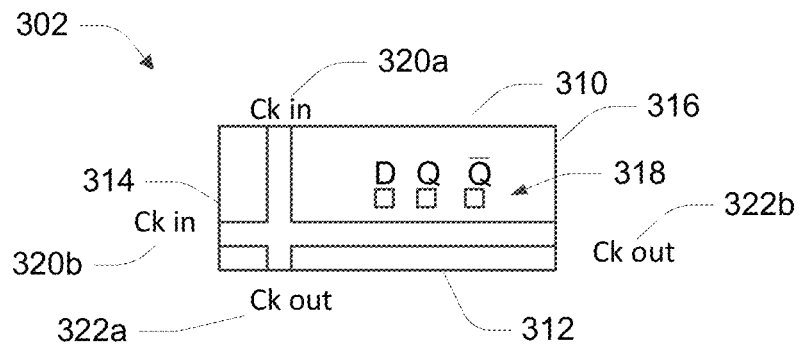
FIG. 8 is a block diagram showing an example of a receiver type flip-flop in accordance with some embodiments.

In accordance with further disclosed embodiments, FIG. 8 illustrates another example of a bit flip-flop 302. As with the earlier-disclosed flip-flops, the flip-flop 302 has an outer periphery with the first border 310, second border 312, third border 314, and fourth border 316. The flip-flop 302 also includes the various input/output terminals 318 such a data input terminal D, and data output terminals Q, Q-bar.

The flip-flop 302 shown in FIG. 8 has two clock input terminals 320a, 320b, and two clock output terminals 322a, 322b. The clock input terminals 320a, 320b are positioned to extend to the first border 310 and the third border 314, respectively. The first clock output terminal 322a is positioned so as to extend to the second border 312 while the second clock output terminal 322b is position so as to extend to the fourth border 318. Thus, the first clock input terminal 320a and the first clock output terminal 322a form a vertical (x-direction) propagation path in the example of FIG. 8, while the second clock input terminal 320b and the second clock output terminal 322b form a horizontal (y-direction) propagation path.

Figure 9:
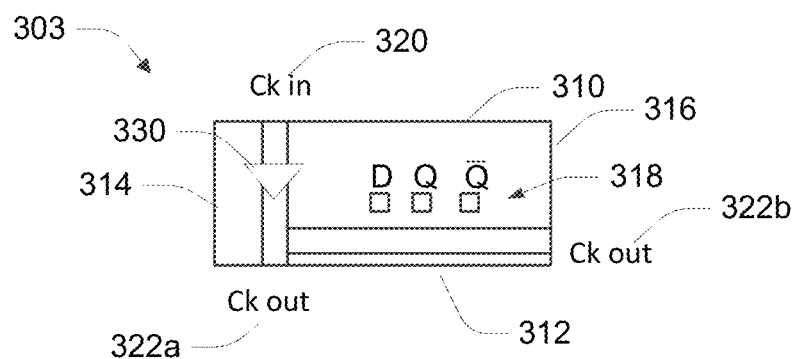
FIG. 9 is a block diagram showing another example of a driver type flip-flop in accordance with some embodiments.

FIG. 9 shows an additional example of a single bit flip-flop 303. Similar to the previous examples, the flip-flop 303 has an outer periphery with the first border 310, second border 312, third border 314, and fourth border 316. The flip-flop 302 also includes the various input/output terminals 318 such a data input terminal D, and data output terminals Q, Q-bar. The flip-flop 303 includes the amplifier 330 and thus may function as a driver flip-flop for a multi-bit arrangement. The flip-flop 303 has one clock input terminal 320, and two clock output terminals 322a, 322b. In the example of FIG. 9, the first clock output terminal 322a is positioned so as to extend to the second border 312 while the second clock output terminal 322b is position so as to extend to the fourth border 318. The driver flip-flop 303 thus receives a single clock pulse at the clock input terminal 320, and outputs clock pulses at both the clock output terminals 322a, 322b for receiver flip-flops situated so as to abut the second and fourth borders 312, 316 of the driver flip-flop 303.

Figure 10:
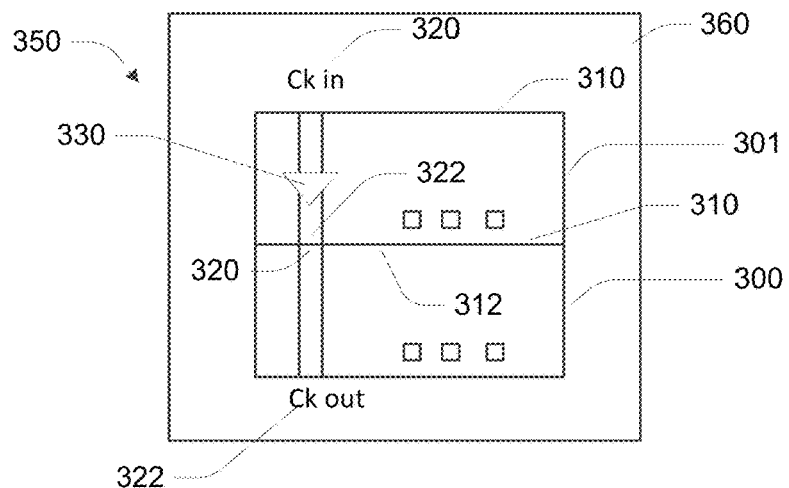
FIG. 10 is block diagram depicting an example of an integrated circuit device including two single bit flip-flop assembled into a multi-bit flip-flop in accordance with some embodiments.

The various examples of the flip-flops disclosed herein thus provide for a variety of possible configurations. FIG. 10 depicts an example of an integrated circuit 350, which could be fabricated according to the method shown in FIG. 6. The integrated circuit 350 includes a substrate 360 having a first driver single bit flip-flop 301 and a second receiver single bit flip-flop 300 adjacent to the first flip-flop 310 in the vertical orientation. The flip-flops 300, 301 are defined by standard layout cells selected from a cell library in some embodiments. The first flip-flop 301 directly abuts the second flip-flop 300 such that the clock output terminal 322 of the first flip-flop 301 electrically connects with the clock input terminal 320 of the second flip-flop 300. The bottom border 312 of the first flip-flop 301 abuts the top border 310 of the second flip-flop 300. The clock pulse received at the clock input terminal 320 of the flip-flop 301 is amplified by the amplifier 330 and then shared with the second flip-flop 300.

Figure 11:
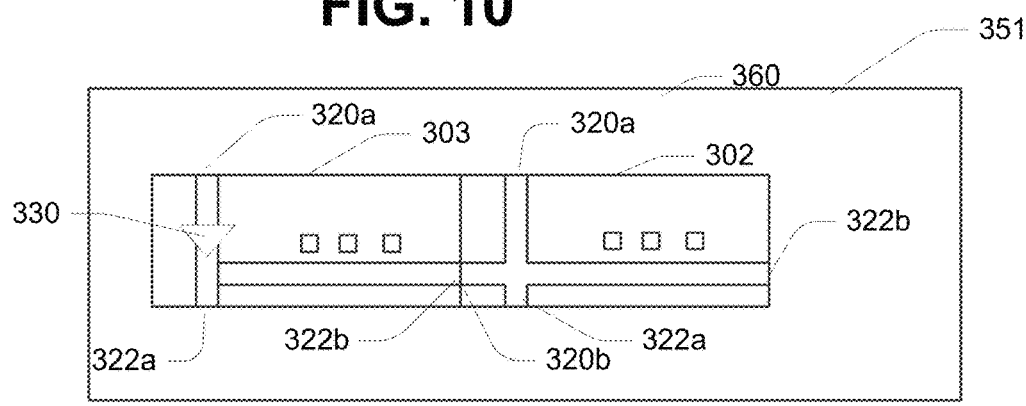
FIG. 11 is block diagram depicting another example of an integrated circuit device including single bit flip-flops assembled into a multi-bit flip-flop in accordance with some embodiments.

In accordance with further disclosed embodiments, FIG. 11 illustrates another example of an integrated circuit 351 including a multi-bit flip-flop formed by a plurality of single bit flip-flops that include both clock input and output terminals. The integrated circuit 351 shown in FIG. 11 has a first driver single bit flip-flop 303 and a second receiver flip-flop 302 adjacent to the first flip-flop 303 in the horizontal orientation. The first and second flip-flops 303, 302 abut one another such that the clock output terminal 322b of the first flip-flop 303 is electrically connected to the clock input terminal 320b of the second flip-flop 302.

Figure 12:
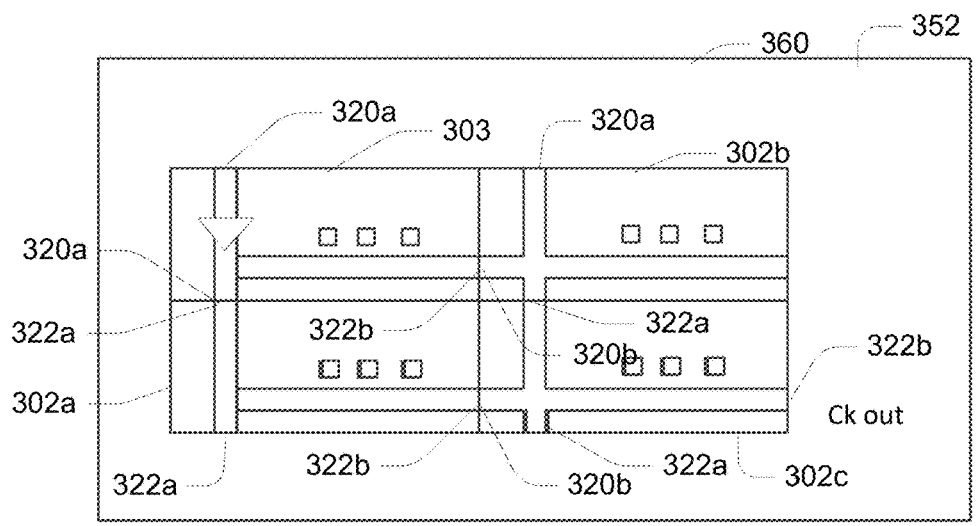
FIG. 12 is block diagram depicting an example of another integrated circuit device including single bit flip-flops assembled into a multi-bit flip-flop in accordance with some embodiments.

In accordance with still further disclosed embodiments, FIG. 12 shows an additional example of an integrated circuit 352. This figure shows and example of a four bit flip-flop in a two by two arrangement. A first driver flip-flop 303 is positioned in the upper left quadrant. A total of three receiver flip-flops 302 are used, where a second flip-flop 302a is adjacent to and abuts the bottom of the first flip-flop 303, a third flip-flop 302b is adjacent to and abuts the right side of the first flip-flop 303, and a fourth flip-flop 302c is adjacent to and abuts both the right side of the second flip-flop 302a and the bottom of the third flip-flop 302b.

The first clock output terminal 322a of the first flip-flop 303 is electrically connected to the first clock input terminal 320a of the second flip-flop 302a positioned below the first flip-flop 303. Additionally the second clock output terminal 322b of the first flip-flop 303 is electrically connected to the second clock input terminal 320b of the third flip-flop 302b positioned to the right of the first flip-flop 303. The second clock output terminal 322b of the second flip-flop 303a is electrically connected to the second clock input terminal 320b of the fourth flip-flop 302c, while the first clock output terminal 322a of the third flip-flop 302b is electrically connected to the second clock input terminal 320b of the fourth flip-flop 302c.

The disclosed flip-flop cells allow for additional variability in multi-bit flip-flop design. With prior multi-bit flip-flop cells, the cell types are pre-defined based on a variety of factors, such as bit count, leakage voltage type, gate length, etc. To vary from the pre-defined multi-bit flip-flop cell designs could be complicated and expensive. The disclosed modular multi-bit flip-flop provides additional flexibility. For instance, if a multi-bit flip-flop having varying voltage threshold types is desired for different bits of the flip-flop, flip-flop cells having the desired voltage thresholds may be selected and assembled into the desired multi-bit flip-flop.

Figure 13:
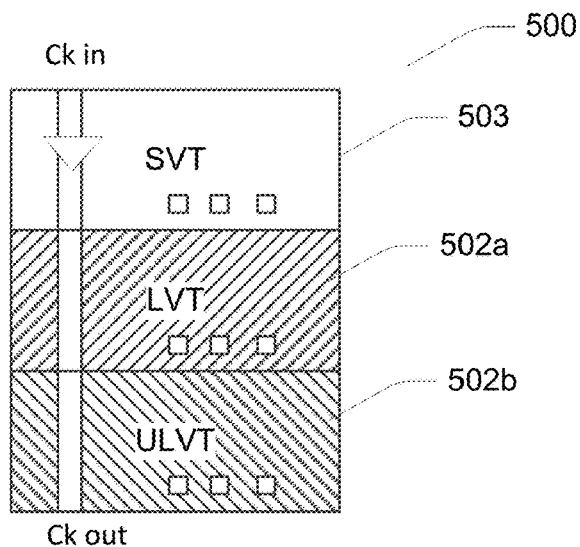
FIG. 13 is a block diagram showing an example of single bit flip-flops having various voltage thresholds assembled into a multi-bit flip-flop in accordance with some embodiments.

FIG. 13 shows an example of such a multi-bit flip-flop 500. In this example, three single bit flip-flops are abutted vertically to each other. The flip-flops include a Standard Threshold Voltage (SVT) driver flip-flop 503, a Low Threshold Voltage (LVT) receiver flip-flop 502a, and an Ultra Low Threshold Voltage (ULVT) receiver flip-flop 503b. The driver flip-flop 503 and receiver flip-flops 502a, 502b are otherwise configured similarly to the driver and receiver flip-flops disclosed earlier herein. The various flip-flops are positioned so as to electrically connect the clock output terminal of one flip-flop with the clock input terminal of the next flip-flop to form a three bit multi-bit flip-flop, wherein each bit of the flip-flop has a different threshold voltage. As can be appreciated the number of, order of, and types of devices used can be altered to suit the needs of the user.

Figure 14:
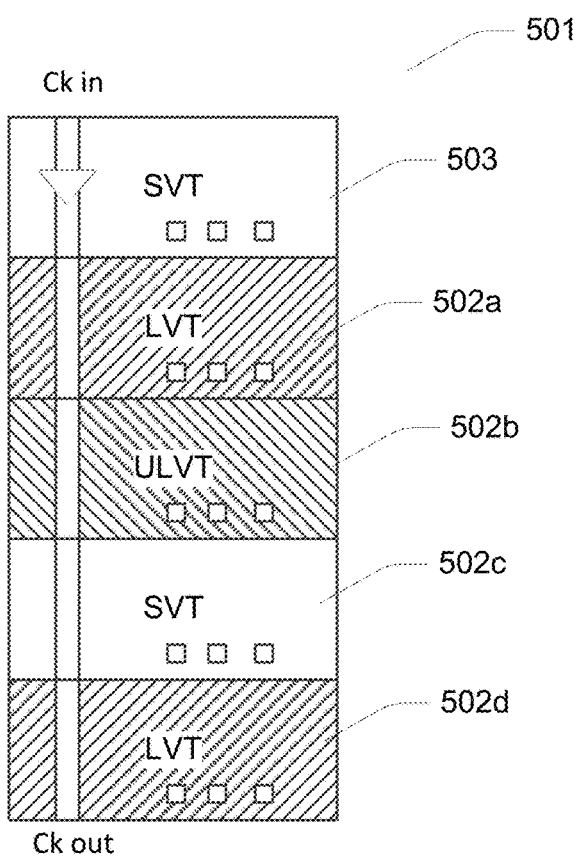
FIG. 14 is a block diagram showing another example of single bit flip-flops having various voltage thresholds assembled into a multi-bit flip-flop in accordance with some embodiments.

FIG. 14 depicts an additional example of a multi-bit flip-flop 501 built from various voltage threshold single bit flip-flops. In this example, five single bit flip-flops are abutted vertically to each other so as to electrically connect the clock output terminal of one flip-flop with the clock input terminal of the next flip-flop to form a five bit multi-bit flip-flop. Like before, a SVT device acts as a driver flip-flop 503, where the clock signal is distributed from. Electrically connected to the SVT is a LVT device acting as a first receiver flip-flop 502a. Further connected to the LVT flip-flop 502a is a ULVT flip-flop acting as a second receiver flip-flop 502b. Connected to this second receiver flip-flop 502b is a third receiver flip-flop 502c, in this example a SVT device. Finally, a LVT flip-flop 502d is connected to the third receiver flip-flop 502c. All the receiver flip-flops share a common clock signal provided by the driver flip-flop 503.

Figure 15:
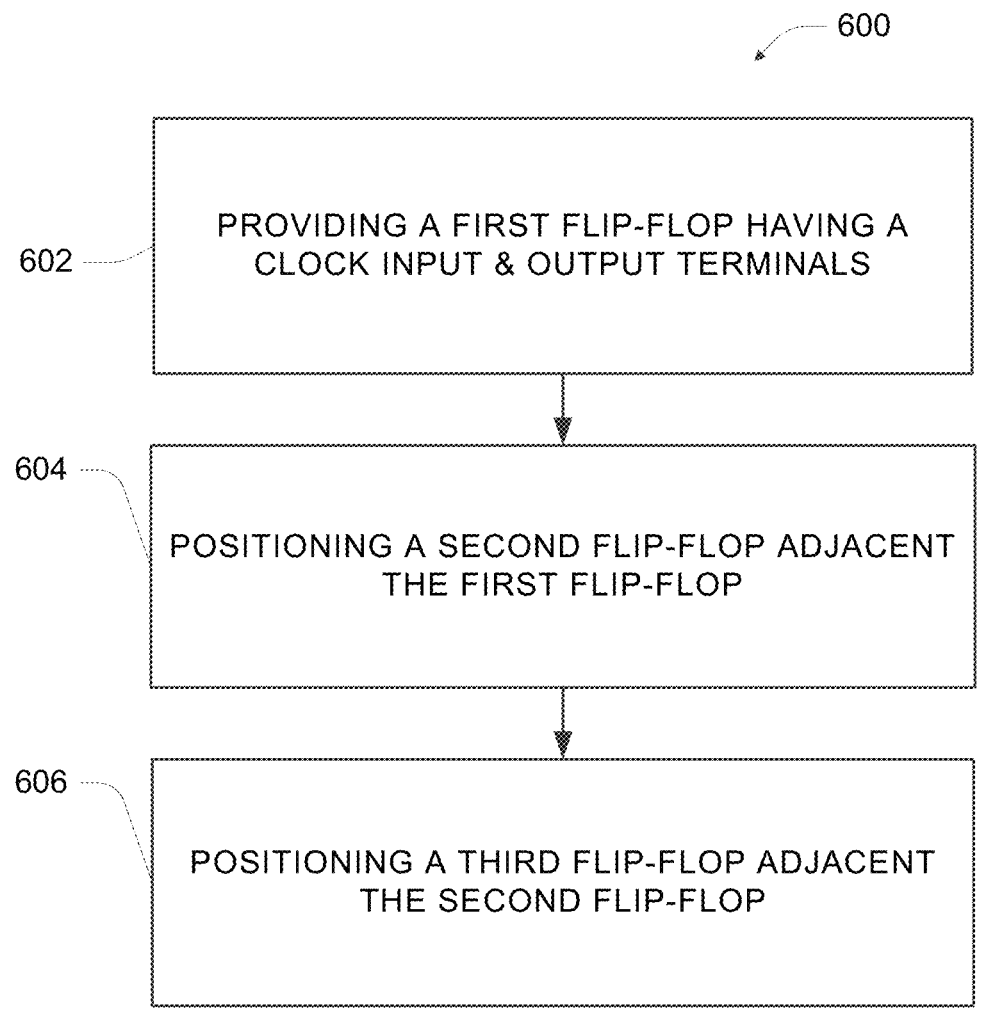
FIG. 15 is a flow diagram illustrating an example of a method for assembling a multi-bit flip-flop from single bit flip-flops in accordance with some embodiments.

FIG. 15 is a flow chart of a method 600 for building a multi-bit flip-flop from single bit flip-flops in accordance with some embodiments. Starting at operation 602, a first flip-flop having a clock input terminal and a clock output terminal is provided. Moving on to operation 604, a second flip-flop having a clock input terminal and a clock output terminal is positioned adjacent to the first flip-flop such that the first flip-flop directly abuts the second flip-flop. Additionally the clock output terminal of the first flip-flop electrically connects with the clock input terminal of the second flip-flop.

Proceeding to operation 606, a third flip-flop having a clock input terminal and a clock output terminal is positioned adjacent to the second flip-flop such that the second flip-flop directly abuts the third flip-flop. Additionally the clock output terminal of the second flip-flop electrically connects with the clock input terminal of the third flip-flop.

Thus, aspects of the present disclosure provide a multi-bit flip-flop formed from a plurality of single bit flip-flop cells that each include clock input and output terminals, such that a common clock pulse drives each bit the multi-bit flip-flop. Disclosed embodiments thus include an integrated circuit that includes a semiconductor substrate with a plurality of circuit elements in or on the substrate. The circuit elements are defined by standard layout cells selected from a cell library. The circuit elements include a plurality of flip-flops, where each flip-flop has a data input terminal, a data output terminal, a clock input terminal, and a clock output terminal. The plurality of flip-flops include a first flip-flop and a second flip-flop adjacent the first flip-flop. The first flip-flop directly abuts the second flip-flop such that the clock output terminal of the first flip-flop electrically connects with the clock input terminal of the second flip-flop.

In accordance with further disclosed embodiments, a flip-flop structure includes a substrate defining an outer periphery. The outer periphery has a first border and a second border. The flip-flop structure has a data input terminal, a data output terminal, a clock input terminal positioned so as to extend to the first border, and a clock output terminal positioned so as to extend to the second border.

In accordance with still further disclosed embodiments, a method for providing a multibit flip-flop circuit includes providing a first flip-flop having a clock input terminal and a clock output terminal. A second flip-flop is positioned adjacent the first flip-flop. The second flip-flop has a clock input terminal and a clock output terminal. The first and second flip-flops are positioned such that the first flip-flop directly abuts the second flip-flop and the clock output terminal of the first flip-flop electrically connects with the clock input terminal of the second flip-flop.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A flip-flop structure defined as a standard cell stored in a cell library, the flip-flop structure comprising:
   a substrate defining an outer periphery comprising a first border, a second border, a third border, and a fourth border, wherein the first border is opposite and parallel to the second border, wherein the third border being opposite and parallel to the fourth border;
   a first clock input terminal positioned so as to extend to the first border;
   a second clock input terminal positioned so as to extend to the third border;
   a first clock output terminal positioned so as to extend to the second border, wherein the first clock output terminal propagates a clock signal received at the first clock input terminal to a first flip-flop abutting the second border; and
   a second clock output terminal positioned so as to extend to the fourth border, wherein the second clock output terminal propagates the clock signal received at the first clock input terminal to a second flip-flop abutting the fourth border.

2. The flip-flop structure of claim 1, wherein the second border is a bottom border and the first border is a top border.

3. The flip-flop structure of claim 1, wherein the third border is a first side border and the fourth border is a second side border.

4. The flip-flop structure of claim 1, wherein the flip-flop structure comprises a single bit flip-flop of a multi-bit flip-flop.

5. The flip-flop structure of claim 1, further comprising an amplifier configured to amplify clock pulse received at the first clock input terminal.

6. The flip-flop structure of claim 5, wherein the amplifier propagates the amplified clock pulse to the first clock output terminal.

7. The flip-flop structure of claim 1, wherein the first clock input terminal and the first clock output terminal form a first clock propagation path in a first direction, and wherein the first clock input terminal and the second clock output terminal form a second clock propagation path in a second direction, the second direction being orthogonal to the first direction.

8. A flip-flop structure defined as a standard cell stored in a cell library, comprising:
   a substrate defining an outer periphery having a first border, a second border, a third border, and a fourth border;
   a first clock input terminal positioned so as to extend to the first border;
   a second clock input terminal positioned so as to extend to the third border;
   a first clock output terminal positioned so as to extend to the second border, wherein the first clock output terminal propagates a clock signal received at the first clock input terminal to a first flip-flop abutting the second border; and a second clock output terminal positioned so as to extend to the fourth border.

9. The flip-flop structure of claim 8, wherein the first clock input terminal and the first clock output terminal form a first clock propagation path in a first direction, and wherein the second clock input terminal and the second clock output terminal form a second clock propagation path in a second direction, the second direction being orthogonal to the first direction.

10. The flip-flop structure of claim 8, further comprising an amplifier configured to amplify clock pulse received at the first clock input terminal.

11. The flip-flop structure of claim 10, wherein the amplifier propagates the amplified clock pulse to the first clock output terminal and the second clock output terminal.

12. The flip-flop structure of claim 8, wherein the flip-flop structure comprises a single bit flip-flop of a multi-bit flip-flop.

13. The flip-flop structure of claim 8, wherein the flip-flop structure comprises a Standard Threshold Voltage (SVT) device.

14. The flip-flop structure of claim 8, wherein the flip-flop structure comprises a Low Threshold Voltage (LVT) device.

15. The flip-flop structure of claim 8, wherein the flip-flop structure comprises an Ultra Low Threshold Voltage (ULVT) device.

16. A flip-flop structure defined as a standard cell stored in a cell library, comprising a substrate defining an outer periphery having a first border, a second border, a third border, and a fourth border;
- a first clock input terminal positioned so as to extend to the first border;
- a second clock input terminal positioned so as to extend to the third border;
- a first clock output terminal positioned so as to extend to the second border; and
- a second clock output terminal positioned so as to extend to the fourth border, wherein each of the third border and the fourth border are perpendicular to each of the first border and the second border, wherein the second clock output terminal propagates a clock signal received at the first clock input terminal to a first flip-flop abutting the fourth border.

17. The flip-flop structure of claim 16, wherein the second border is a bottom border and the first border is a top border.

18. The flip-flop structure of claim 16, wherein the third border is a first side border and the fourth border is a second side border.

19. The flip-flop structure of claim 16, wherein the flip-flop structure comprises a single bit flip-flop of a multi-bit flip-flop.

* * * * *